United States Patent
Schubert et al.

(10) Patent No.: US 11,581,405 B2
(45) Date of Patent: Feb. 14, 2023

(54) METHODS, DEVICES, AND SYSTEMS RELATED TO FORMING SEMICONDUCTOR POWER DEVICES WITH A HANDLE SUBSTRATE

(71) Applicant: Micron Technology, Inc., Boise, ID (US)

(72) Inventors: Martin F. Schubert, Boise, ID (US); Vladimir Odnoblyudov, Eagle, ID (US); Cem Basceri, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/626,634

(22) Filed: Jun. 19, 2017

(65) Prior Publication Data
US 2017/0294511 A1 Oct. 12, 2017

Related U.S. Application Data

(63) Continuation of application No. 13/774,313, filed on Feb. 22, 2013, now Pat. No. 9,768,271.

(51) Int. Cl.
*H01L 29/10* (2006.01)
*H01L 21/683* (2006.01)
(Continued)

(52) U.S. Cl.
CPC ...... *H01L 29/1029* (2013.01); *H01L 21/6835* (2013.01); *H01L 21/6836* (2013.01);
(Continued)

(58) Field of Classification Search
CPC ........... H01L 29/1029; H01L 29/42316; H01L 23/53214; H01L 27/013; H01B 17/62
(Continued)

(56) References Cited

U.S. PATENT DOCUMENTS 4,507,845 A * 4/1985 McIver ............... H01L 29/4175
148/DIG. 82
5,073,230 A 12/1991 Maracas et al.
(Continued)

FOREIGN PATENT DOCUMENTS

| WO | 2001080286 A2 | 10/2001 |
| WO | 2008147102 A1 | 12/2008 |
| WO | 2010132552 A1 | 11/2010 |

OTHER PUBLICATIONS

International Search Report and Written Opinion dated Jun. 19, 2014 in International Patent Application No. PCT/US2014/017982, 14 pages.
(Continued)

*Primary Examiner* — Sheng-Bai Zhu
(74) *Attorney, Agent, or Firm* — Perkins Coie LLP

(57) ABSTRACT

Methods of manufacturing device assemblies, as well as associated semiconductor assemblies, devices, systems are disclosed herein. In one embodiment, a method of forming a semiconductor device assembly includes forming a semiconductor device assembly that includes a handle substrate, a semiconductor structure having a first side and a second side opposite the first side, and an intermediary material between the semiconductor structure and the handle substrate. The method also includes removing material from the semiconductor structure to form an opening extending from the first side of the semiconductor structure to at least the intermediary material at the second side of the semiconductor structure. The method further includes removing at least a portion of the intermediary material through the opening in the semiconductor structure to undercut the second side of the semiconductor structure.

21 Claims, 6 Drawing Sheets

(51) Int. Cl.
  *H01L 29/778* (2006.01)
  *H01L 29/06* (2006.01)
  *H01L 27/06* (2006.01)
  *H01L 29/66* (2006.01)
  *H01L 29/423* (2006.01)
  *H01L 29/20* (2006.01)

(52) U.S. Cl.
  CPC ...... *H01L 27/0605* (2013.01); *H01L 29/0653* (2013.01); *H01L 29/0657* (2013.01); *H01L 29/42316* (2013.01); *H01L 29/66462* (2013.01); *H01L 29/778* (2013.01); *H01L 29/7787* (2013.01); *H01L 29/2003* (2013.01); *H01L 2221/6834* (2013.01); *H01L 2221/68327* (2013.01); *H01L 2221/68368* (2013.01); *H01L 2221/68381* (2013.01)

(58) Field of Classification Search
  USPC ...................................................... 257/194
  See application file for complete search history.

(56) References Cited

U.S. PATENT DOCUMENTS

| | | | | |
|---|---|---|---|---|
| 5,508,535 | A * | 4/1996 | Nakanishi | H01L 21/306 |
| | | | | 257/192 |
| 5,641,977 | A * | 6/1997 | Kanamori | H01L 29/66318 |
| | | | | 257/192 |
| 6,172,384 | B1 * | 1/2001 | Morikawa | H01L 29/66462 |
| | | | | 257/280 |
| 6,271,547 | B1 * | 8/2001 | Hoke | H01L 29/66462 |
| | | | | 257/192 |
| 7,687,876 | B2 | 3/2010 | Kabir | |
| 7,968,379 | B2 | 6/2011 | Chu et al. | |
| 2001/0031514 | A1 | 10/2001 | Smith et al. | |
| 2002/0117728 | A1 | 8/2002 | Brosnihan et al. | |
| 2003/0235974 | A1 | 12/2003 | Martinez et al. | |
| 2006/0073621 | A1 | 4/2006 | Kneissel et al. | |
| 2008/0237605 | A1 | 10/2008 | Murata et al. | |
| 2008/0280423 | A1 | 11/2008 | Reeder et al. | |
| 2009/0014769 | A1 * | 1/2009 | Collonge | H01L 29/515 |
| | | | | 438/257 |
| 2009/0057719 | A1 | 3/2009 | Takahashi et al. | |
| 2009/0155972 | A1 | 6/2009 | Watanabe et al. | |
| 2010/0066348 | A1 | 3/2010 | Merz et al. | |
| 2010/0110157 | A1 | 5/2010 | Yonehara et al. | |
| 2010/0317132 | A1 | 12/2010 | Rogers et al. | |
| 2011/0159624 | A1 | 6/2011 | Wang et al. | |
| 2011/0159625 | A1 | 6/2011 | Kitamura et al. | |
| 2012/0211727 | A1 | 8/2012 | Ohlsson et al. | |
| 2012/0211828 | A1 * | 8/2012 | Bobde | H01L 29/407 |
| | | | | 257/330 |
| 2012/0244683 | A1 | 9/2012 | Akagi | |
| 2013/0032784 | A1 | 2/2013 | Chaji et al. | |
| 2014/0094223 | A1 * | 4/2014 | Dasgupta | H01L 29/4236 |
| | | | | 455/566 |
| 2014/0239348 | A1 | 8/2014 | Schubert et al. | |

OTHER PUBLICATIONS

Extended European Search Report dated Dec. 1, 2016 in European application No. 14753869.8, 11 pages.
Office Action dated Aug. 31, 2015 in Taiwan application No. 103105926, 18 pages.
Office Action dated Jun. 7, 2016 in Taiwan application No. 103105926, 7 pages.
Supplementary European Search Report dated Aug. 31, 2016, in European Application No. 14753869.8, 7 pages.
Office Action dated Jan. 14, 2021 for European Application No. 14753869.8, 5 pages.

* cited by examiner though the handle substrate is not used in the operation of the semiconductor device, it is a part of the semiconductor device and can contribute to parasitic conduction losses. The parasitic conduction losses of the handle substrate limit device efficiency, and a particular handle substrate may not be suitable for high-voltage/high-power applications. Accordingly, there is a need to improve device efficiency and performance by reducing the parasitic conduction losses attributable to the handle substrate.

METHODS, DEVICES, AND SYSTEMS RELATED TO FORMING SEMICONDUCTOR POWER DEVICES WITH A HANDLE SUBSTRATE

CROSS-REFERENCE TO RELATED APPLICATION(S)

This application is a continuation of U.S. patent application Ser. No. 13/774,313 filed Feb. 22, 2013, which is incorporated herein by reference in its entirety.

TECHNICAL FIELD

The present technology is related to semiconductor devices that are fabricated with a support substrate. In particular, some embodiments of the present technology are related to power transistor devices and methods for manufacturing such devices.

BACKGROUND

High electron mobility transistors (HEMTs) employ a heterojunction defined by semiconductor materials having different bandgap energy levels. A gate provides an applied electric field to the heterojunction, which causes a conductive channel to be formed between the source and drain of the HEMT. Another electrical field applied across the source and drain causes an electrical current to flow through the conductive channel. When the applied field of the gate is removed, the electrical current between the source and drain will cease flowing, even when the applied field between the source and drain is not removed. High voltage HEMTs are used in a variety of devices and applications, including power supplies, electric cars, solar cells, and large solid state transistors, to name a few.

The breakdown voltage of a high voltage device is proportional to the amount of parasitic electrical current that leaks away from the current flowing between the source and the drain. When a voltage larger than the breakdown voltage is applied, parasitic current will flow regardless of whether there is an applied field provided by the gate (i.e., when the device is in an off state). This parasitic current limits device performance, including the maximum operational voltage.

DETAILED DESCRIPTION

Figure 1A:
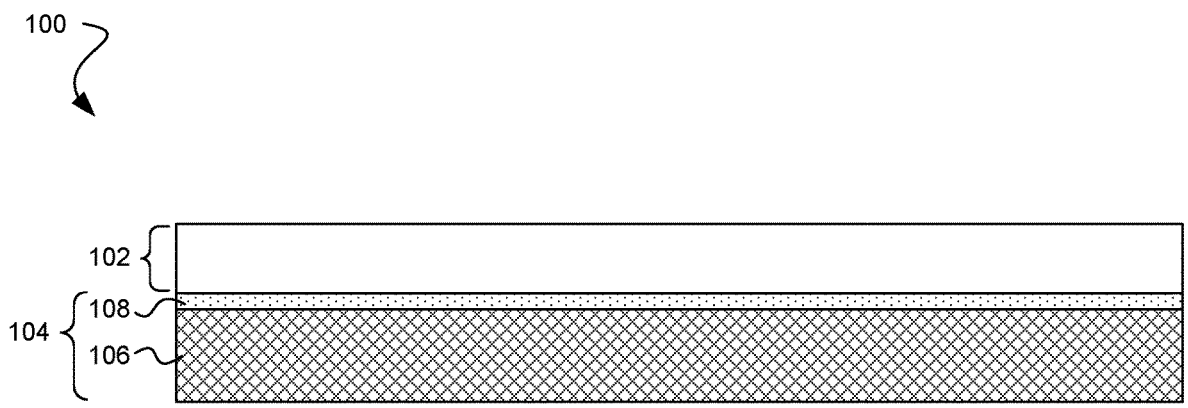
FIGS. 1A-E are cross-sectional views illustrating a method of forming a semiconductor device assembly in accordance with selected embodiments of the present technology.

Specific details of several embodiments of methods for making semiconductor devices are described herein along with related devices and systems. The term "semiconductor device" generally refers to a solid-state device that includes semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer-level or at the die-level. Furthermore, unless the context indicates otherwise, structures disclosed herein can be formed using conventional semiconductor-manufacturing techniques. Materials can be deposited, for example, using chemical vapor deposition, physical vapor deposition, atomic material deposition, spin coating, and/or other suitable techniques. Similarly, materials can be removed, for example, using plasma etching, wet etching, chemical-mechanical planarization, or other suitable techniques. Further, features can be formed in structures, for example, by forming a patterned mask (e.g., a photoresist mask or a hard mask) on one or more semiconductor materials and depositing materials or removing materials in combination with the patterned mask Many embodiments of the present technology are applicable to power transistors having high operating voltages (e.g., high electron mobility transistors (HEMTs)). A person having ordinary skill in the relevant art will recognize, however, that the present technology may apply to other types of semiconductor devices, including bipolar transistors or solid state transducer devices that emit light (e.g., light emitting diodes (LEDs), laser diodes, etc.). Also, while described herein in the context of compound semiconductor devices (e.g., III-nitride-based semiconductor devices), embodiments of the present technology are not so limited and can include other types of materials. For example, semiconductor devices can be manufactured in Silicon (Si). Further, the present technology may be practiced without several of the details of the embodiments described herein with reference to FIGS. 1A-8.

For ease of reference, throughout this disclosure identical reference numbers are used to identify similar or analogous components or features, but the use of the same reference number does not imply that the parts should be construed to be identical. Indeed, in many examples described herein, the identically-numbered parts are distinct in structure and/or function. Furthermore, the same shading may be used to indicate materials in a cross section that can be compositionally similar, but the use of the same shading does not imply that the materials should be construed to be identical.

As discussed above in the background section, parasitic conduction can limit semiconductor device performance. Parasitic current can flow between active regions of the device as well as through the bulk material of the semiconductor device (e.g., the substrate region adjacent to or below the active regions). In a conventional compound semiconductor device, the bulk substrate usually includes a portion of the substrate used to form the device. This substrate, commonly referred to as a "handle" substrate, can provide a support surface for epitaxial growth. The handle substrate is typically not removed because removal requires additional processing steps that complicate manufacturing and increase manufacturing costs. Rather, the handle substrate is singulated along with the other semiconductor materials to form the semiconductor device.

Methods and devices in accordance with embodiments of the present technology, however, can provide several advantages over these and other manufacturing techniques. A method can include, for example, removing an intermediary material (e.g., a sacrificial material) located between a semiconductor structure and a handle substrate to provide mechanical and electrical isolation from the handle substrate. In some embodiments, most (or all) of the intermediary material is removed to decouple the semiconductor structure from the handle substrate. In other embodiments, only a portion of the intermediary material is removed to form a gap between the semiconductor structure and the handle substrate. In these embodiments, the semiconductor structure and the handle substrate remain coupled together through intermediary material.

In general, the intermediary material is removed via openings formed in the semiconductor structure (e.g., by removing the intermediary material away from the structure through the openings and/or dissolving the intermediary material adjacent the openings). These openings, for example, can be trenches that also serve to separate the semiconductor structure into individual semiconductor devices. In additional or alternative embodiments, the openings can extend through an active region of the device to provide access to the intermediary material through the opening in the active region. In further embodiments, other openings can extend partially through the semiconductor structure to mechanically isolate active regions of the structure from one another.

FIGS. 1A-1E are cross-sectional side views of a semiconductor device assembly 100 in various stages of manufacture in accordance with selected embodiments of the present technology. FIG. 1A shows the semiconductor device assembly 100 after a semiconductor structure 102 has been formed on a support structure 104. The semiconductor structure 102 can have a plurality of dies or other structures that include integrated circuitry or other types of semiconductor devices. As such, the semiconductor structure 102 can include a single semiconductor material, a stack of different semiconductor materials, as well as other suitable materials. Although omitted for purposes of clarity, a person having ordinary skill in the art will appreciate that the semiconductor structure 102 can include a variety of materials. For example, in addition to materials that are semiconductive, the semiconductor structure 102 can include conductive materials (e.g., metallic materials) and insulative materials (e.g., dielectric materials). Also, the semiconductor structure 102 can include a variety of features formed throughout the structure. For example, the semiconductor structure 102 can include a through-substrate interconnect (not shown) that extends through the semiconductor structure 102. Such a through-substrate interconnect can electrically connect opposite sides of a finished semiconductor device, for example.

The support structure 104 includes a handle substrate 106 and an intermediary material 108 between the handle substrate 106 and the semiconductor structure 102. The handle substrate 106 can mechanically support the semiconductor structure 102 during manufacturing. The handle substrate 106 can also facilitate formation of one or more materials, features, or other aspects of the semiconductor structure 102. For example, the handle substrate 106 can facilitate the growth of epitaxial semiconductor materials on the handle substrate 106. In some embodiments, the handle substrate 106 can include ceramic, glass, poly-Aluminum Nitride (p-AlN), or other suitable materials. P-AlN-based handle substrates, for example, can have a coefficient of thermal expansion (CTE) that is similar to the CTE of Gallium Nitride (GaN)-based materials.

The intermediary material 108 is between the semiconductor structure 102 and the handle substrate 106. As discussed above, the intermediary material 108 is a sacrificial material that can be removed (or at least partially removed) from between the semiconductor structure 102 and the handle substrate 106. For example, the intermediary material 108 can include a deposited oxide material and/or a native oxide. In some embodiments, oxide materials can be fused together to attach the semiconductor structure 102 with the handle substrate 106. For example, the native oxide of the semiconductor structure 102 can be fused with an oxide material of the handle substrate 106. The intermediary material 108 can also include a different material in addition to or in lieu of an oxide material. For example, the intermediary material 108 can include a nitride-based material.

Figure 1B:
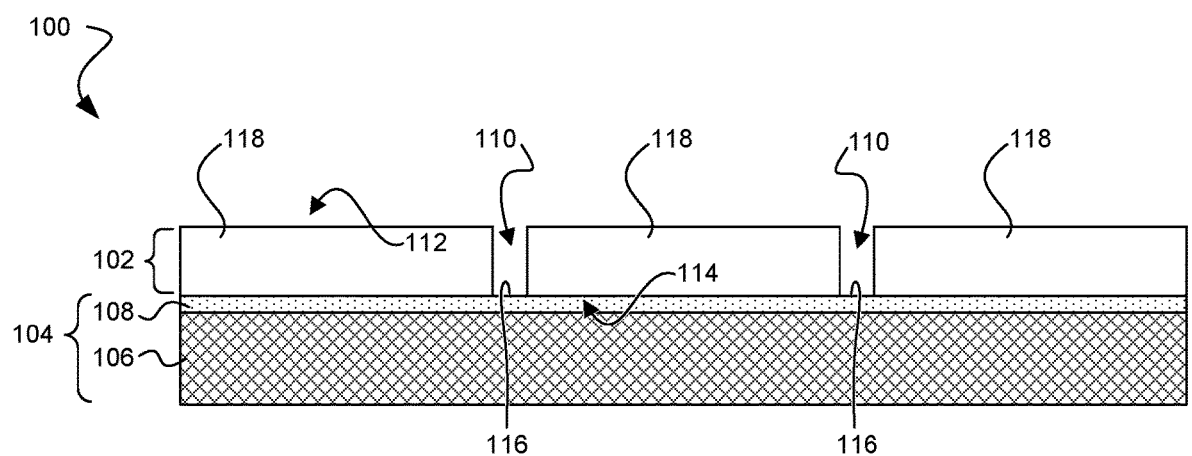

FIG. 1B shows the semiconductor device assembly 100 after removing material from the semiconductor structure 102 to form openings 110 in the semiconductor structure 102. In particular, the openings 110 can extend from a first side 112 of the semiconductor structure 102 to a second side 114 of the semiconductor structure 102 to expose surfaces 116 of the intermediary material 108 through the openings 110. The exposed surfaces 116, for example, can be flush with the semiconductor structure 102 at the second side 114 of the structure. In other embodiments, the exposed surfaces 116 can be recessed in the intermediary material 108, or the openings 110 can extend completely through the intermediary material 108 (not shown) such that the exposed surfaces 116 are just the remaining sidewalls of the intermediary material 108. For example, the openings 110 can be configured to expose a portion of the handle substrate 106 through the openings 110. In several embodiments, the openings 110 can at least partially define individual mesas 118 in the semiconductor structure 102. For example, in one embodiment described in further detail below with reference to FIG. 2, the openings 110 can include trenches that isolate the individual mesas 118 from one another. Each mesa 118 can define a die having one or more integrated circuits or other features.

Figure 1C:
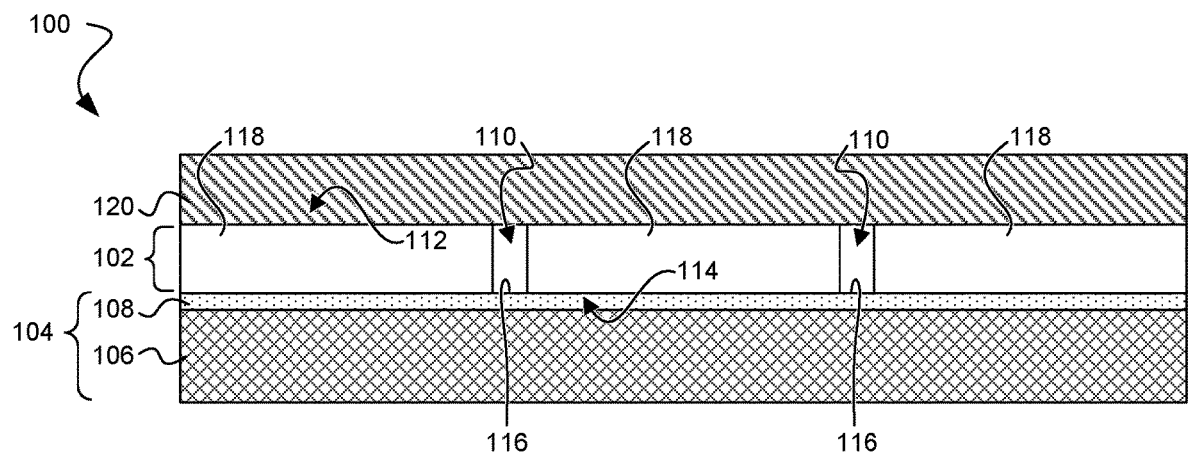

FIG. 1C shows the semiconductor device assembly 100 after a transfer structure 120 is attached to the semiconductor structure 102. The transfer structure 120 can include an adhesive (not shown) for at least temporarily binding the individual mesas 118 with the transfer structure 120. The transfer structure 120 is configured to support the individual mesas 118 of the semiconductor structure 102 after the handle substrate 106 has been removed. The transfer structure 120 can include a die-attach tape, a carrier substrate (e.g., a wafer), or other suitable structure that is configured to support the individual mesas 118 in subsequent processing stages. In some embodiments, the transfer structure 120 can be used to shield the active surfaces of the semiconductor structure 102 from contamination and debris associated with operator handling. The transfer structure 120 can also provide a diffusion barrier that mitigates oxidation at the active surfaces of the individual mesas 118. In other embodiments, however, the transfer structure 120 can be omitted, and thus the manufacturing stage at FIG. 1C can likewise be omitted. For example, the transfer structure 120 can be omitted in embodiments in which the semiconductor structure 102 is not decoupled from the support structure 104 (see, e.g., FIGS. 6 and 7).

Figure 1D:
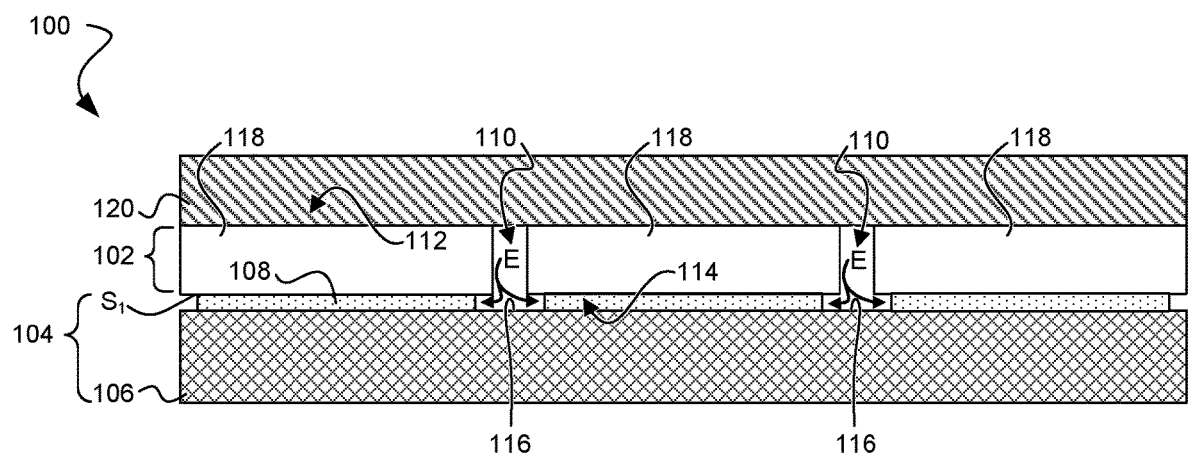

FIG. 1D shows the semiconductor device assembly 100 after a portion of the intermediary material 108 adjacent the openings 100 has been removed via the openings 110 of the semiconductor structure 102. In particular, the removed intermediary material forms a gap $S_1$ that undercuts the individual mesas 118 of the semiconductor structure 102 at the second side 114. In some embodiments, the semiconductor device assembly 100 can be placed into a chemical etchant (e.g., a chemical bath) to submerge or at least partially submerge the semiconductor structure 102 in the etchant. As shown by arrows "E", the etchant undercuts the portions of the semiconductor structure 102 adjacent the openings 110 in the semiconductor structure 102. The transfer structure 120 can be configured such that it does not substantially degrade in an acidic (or basic) solution of the chemical etchant.

Figure 1E:
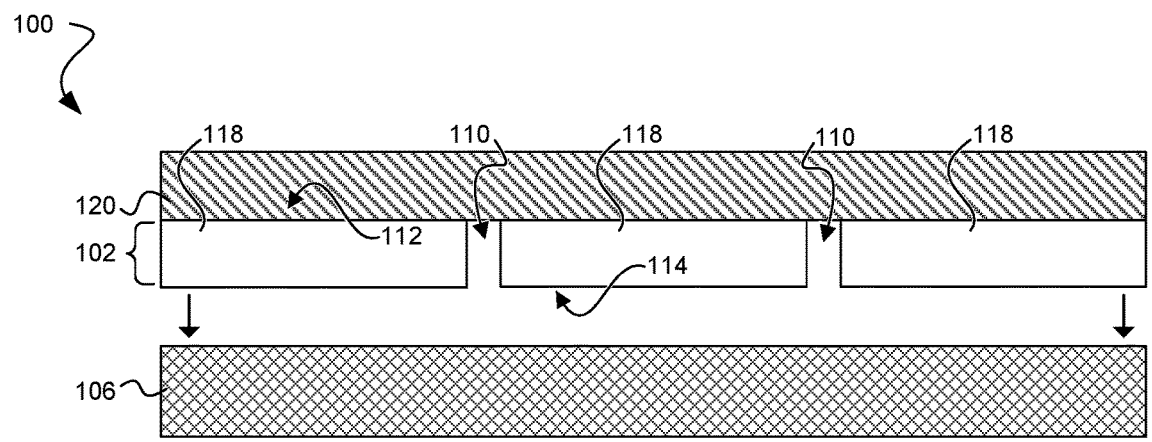

FIG. 1E shows the semiconductor device assembly 100 after the semiconductor structure 102 has been decoupled from the handle substrate 106. In particular, the semiconductor structure 102 is decoupled by removing the intermediary material 108 (FIG. 1D) until the handle substrate 106 is released from the semiconductor structure 102. Once released, the handle substrate 106 can be recycled and used to form other semiconductor structures. Alternatively, the handle substrate 106 can be discarded depending on the life-cycle of the handle substrate 106. For example, the handle substrate 106 can be discarded if it has become too thin, contaminated, and/or cycled more than a pre-determined number of times.

Figure 2:
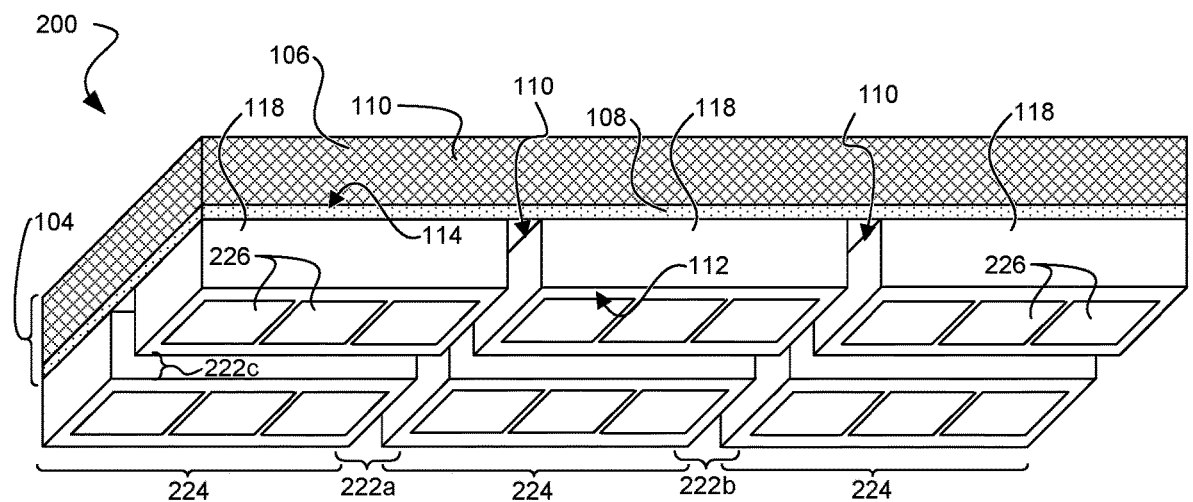
FIG. 2 is an isometric view of a semiconductor device assembly in accordance with a selected embodiment of the present technology.

FIG. 2 is an isometric view of a semiconductor device assembly 200 configured in accordance with a selected embodiment of the present disclosure. The semiconductor device assembly 200 can be similar to the semiconductor device assembly 100 after the processing stage of FIG. 1B, but in FIG. 2 the semiconductor device assembly 200 is inverted. In the embodiment shown in FIG. 2, the openings 110 between the individual mesas 118 are trenches 222 (identified individually as first through third trenches 222a-222c) that extend to the intermediary material 108 of the support structure 104. In the illustrated embodiment, the first and second trenches 222a and 222b are generally in parallel with one another and are generally perpendicular with the third trench 222c. In this configuration, the trenches 222 separate the semiconductor structure 102 to form discrete semiconductor devices 224. Although the Figures show the trenches 22 in a linear arrangement, in other embodiments one or more of the trenches 222 can have a non-linear arrangement (e.g., curved, sloped, etc.)

The semiconductor devices 224 can include electrical contacts 226 (e.g., metal contact pads). In one embodiment, the semiconductor structure 102 (FIG. 1A) can be formed to include the electrical contacts 226. Alternatively, the electrical contacts 226 can be formed on the semiconductor structure 102 at a later processing stage. The electrical contacts 226 can include a variety of suitable conductive materials that are electrically coupled to one or more active regions of the semiconductor devices 224. In the illustrated embodiment, the semiconductor devices 224 are "direct-attach" devices in which the electrical contacts can be directly bonded (e.g., via eutectic bonding) to a printed circuit board (not shown) or other suitable substrates. In several embodiments, direct-attach configurations can simplify assembly of semiconductor devices on such a substrate.

Figure 3:
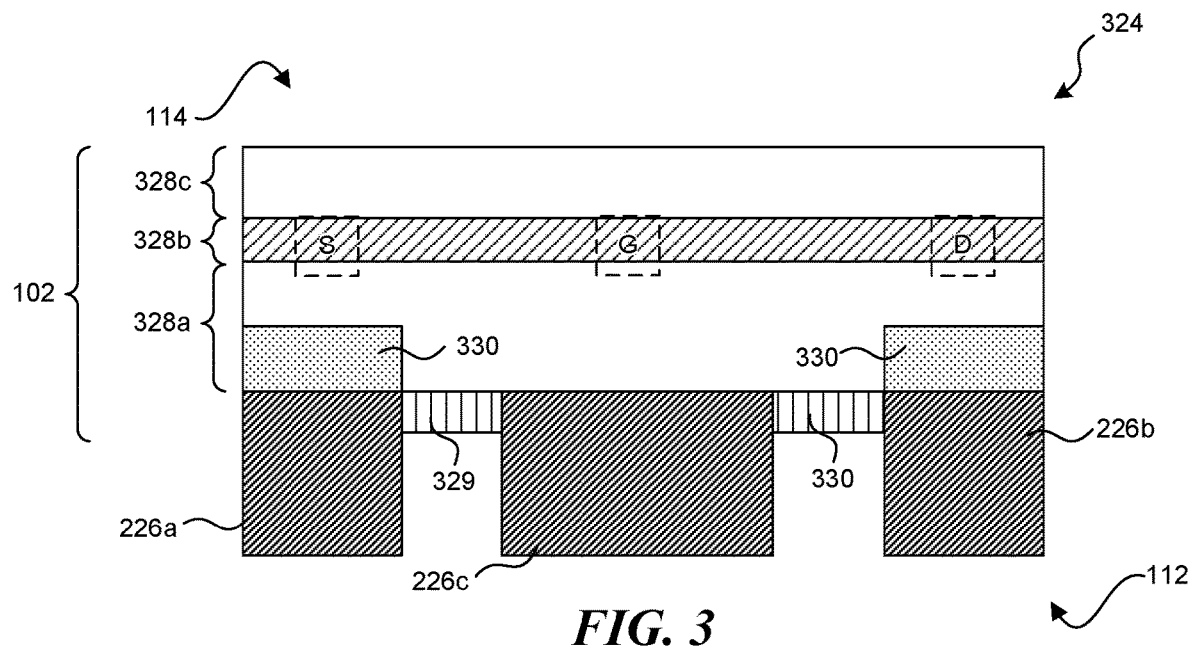
FIGS. 3-6 are cross-sectional views illustrating semiconductor devices in accordance with selected embodiments of the present technology.

FIG. 3 is a schematic cross-sectional side view of a semiconductor device 324 configured in accordance with an embodiment of the present technology. The semiconductor device 324, for example, can be similar to one of the semiconductor devices 224 of FIG. 2 after the support structure 104 has been removed. The semiconductor structure 102 of the semiconductor device 324 includes a stack of semiconductor materials 328 (identified individually as first through third semiconductor materials 328a-c). For clarity, active regions of the semiconductor structure 102 are identified as source "S," gate "G," and drain "D" regions of a transistor device (e.g., of a HEMT power transistor device). However, embodiments of the semiconductor device 324 can include other types of active regions. For example, in other embodiments, active regions can include regions other than source, gate, and/or drain regions. Further, the active regions can be located in another type device, such as a bipolar transistor device, a capacitor, etc.

The semiconductor device 324 further includes electrical contacts 226 (identified individually as first through third electrical contacts 226a-226c) and a dielectric material 329 (e.g., Silicon Nitride (SiN)) that separates the individual electrical contacts 226 from one another. The first and second electrical contacts 226a and 226b are coupled, respectively, to the source S and drain D regions of the semiconductor structure 102 through Ohmic contact regions 330 (e.g., locally doped regions of the first semiconductor material 328a). The third electrical contact 226c is coupled to the gate region G of the semiconductor device 324 without an intermediary Ohmic contact region. In one embodiment, the first semiconductor material 328a of the semiconductor device 324 includes Aluminum GaN (AlGaN) and the second semiconductor material 328b includes GaN. In several embodiments, the third semiconductor material 328c can include AlGaN. In other non-illustrated embodiments the semiconductor device 324 can include different materials and/or features.

In operation, the gate region G provides a conductive channel (e.g., a two-dimensional electron gas channel) that extends between the source region S and the drain region D of the semiconductor device 324. As discussed above, the semiconductor device 324 can have less parasitic conduction (or no parasitic conduction) relative to conventional semiconductor devices. In particular, the handle substrate 106 (FIG. 1E) has been decoupled to remove parasitic conduction paths.

Figure 4:
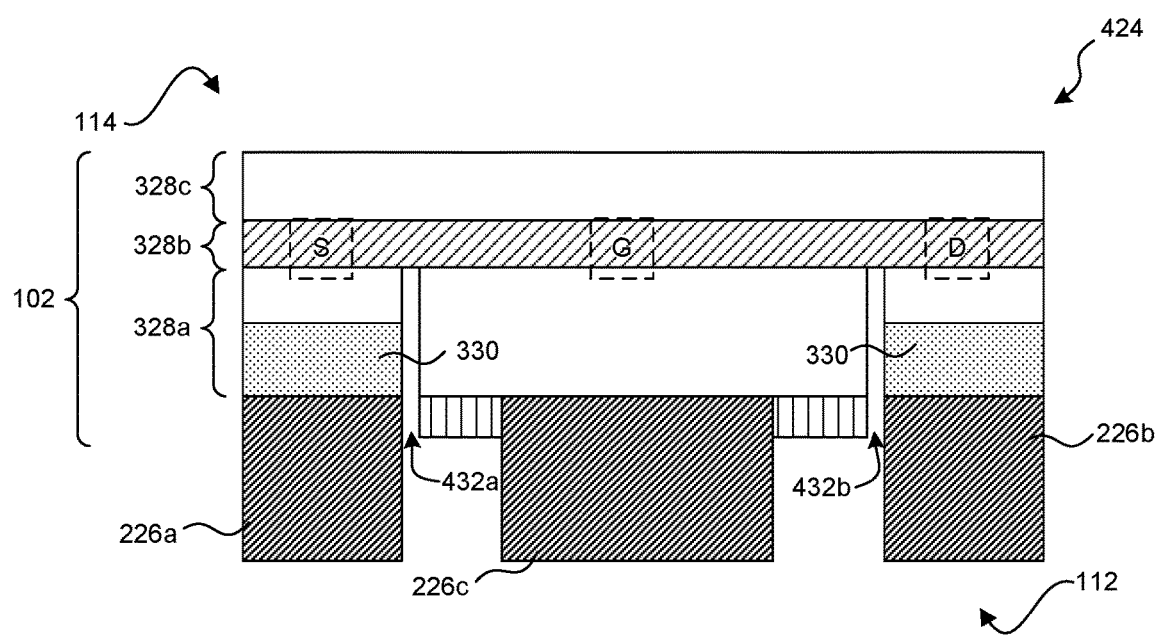

FIG. 4 is a schematic cross-sectional side view of a semiconductor device 424 configured in accordance with another embodiment of the present technology. The semiconductor device 424, for example, can be similar to the semiconductor device 324 of FIG. 3. However, the semiconductor device 424 is different than the semiconductor device 324 of FIG. 3 in that the semiconductor device 424 includes first and second trenches 432a and 432b formed in the semiconductor structure 102. In particular, the first and second trenches 432a and 432b mechanically isolate the source and drain regions S and D from the gate region G. Such mechanical isolation can, for example, decrease parasitic conduction between the source region S and the gate region G and/or the drain region D and the gate region G.

In one embodiment, the first and second trenches 432a and 432b can be formed in the semiconductor structure 102 by one or more etch processes. For example, the second semiconductor material 328b can be configured as an etch stop material. Alternatively, the etch processes can be timed to form the first and second trenches 432a and 432b to a depth that does not substantially extend (or extend at all) into the second semiconductor material 328b. In one embodiment, the first and second trenches 432a and 432b are formed in the semiconductor structure 102 at stage before the stage of FIG. 1A. In other embodiments, the first and second trenches are formed at a different manufacturing stage. For example, the first and second trenches 432a and 432b can be formed in semiconductor device assembly that incorporates a portion of the handle substrate into the finished device.

Figure 5:
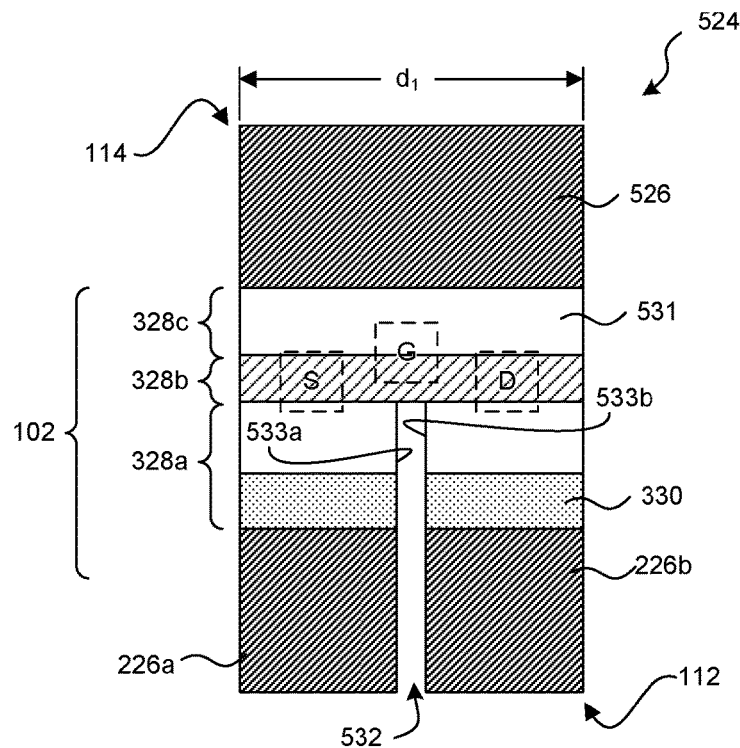

FIG. 5 is a schematic cross-sectional side view of a semiconductor device 524 configured in accordance with a further embodiment of the present technology. The semiconductor device 524, for example, can be similar to the semiconductor device 424 of FIG. 4. However, the semiconductor device 524 includes an electrical contact 526 at the second side 114 of the semiconductor device 424 (rather than between the source and drain regions S and D at a first side 112 of the semiconductor device). The electrical contact 526 can be formed, for example, by depositing a conductive material on the third semiconductor material 328c at the second side 114 of the semiconductor device 524. In this example, the third semiconductor material 328c can be the gate region G. In some embodiments, a dimension $d_1$ (e.g., a length or a surface area) can be configured to achieve a certain capacitance at the gate region G. Such a configuration has several advantages over conventional devices in that the dimension $d_1$ does not change the overall footprint of the semiconductor device 524 (so long as the dimension $d_1$ of the gate region G is smaller than the combined dimensions of the first and second electrical contacts 226a and 226b). By contrast, a gate region in a conventional transistor device is typically constrained to a particular range of dimensions. In particular, because the source, gate, and drain regions of a conventional device are all located at the same side of the device, each region contributes to the overall footprint. For example, to retain a certain footprint size, the gate region can only be increased in size if one or both of the source and drain regions S and D are decreased in size.

The semiconductor device 524 is also different than the semiconductor device 424 of FIG. 4 in that the semiconductor device 524 includes a trench 532 between the source region S and the drain region D (rather than between the gate region G and each of the source region S and the drain region D). The trench 532 includes a first sidewall 533a adjacent the source region S and a second sidewall 533b adjacent the drain region D. In some embodiments, however, the trench 532 can be omitted and the source region S can be isolated from the drain region D differently. For example, the source region S and the drain region D can include semiconductor material with different doping types (e.g., P-type or N-type) to form a reverse-biased diode between these regions.

Figure 6:
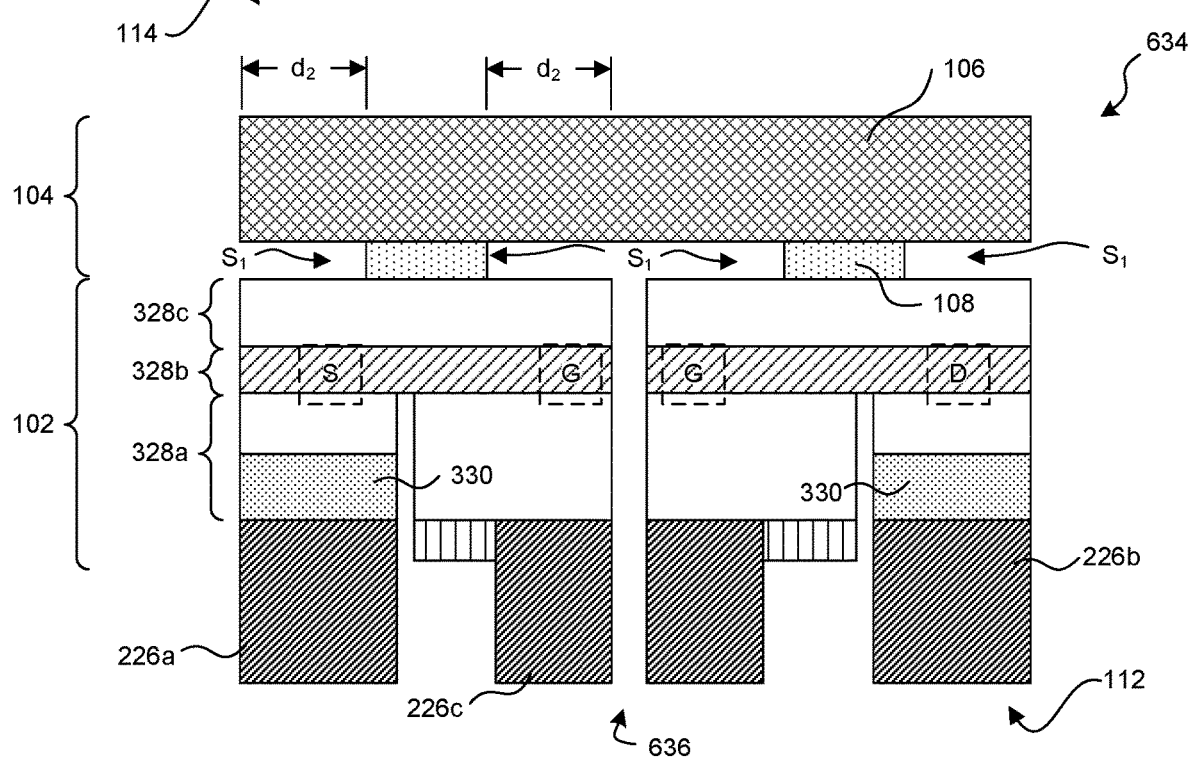

FIG. 6 is a schematic cross-sectional side view of a semiconductor device 634 configured in accordance with yet another embodiment of the present technology. The semiconductor device 634 is different than the semiconductor devices 224 of FIG. 2 in that the semiconductor device 634 remains coupled to the handle substrate 106 via the intermediary material 108. As illustrated, the semiconductor device 634 includes an opening 636 formed through the gate region G of the semiconductor device 634. In this configuration, the opening 636 provides a passageway through which an etchant can remove a portion of the intermediary material 108 to undercut the gate region G. The amount of undercut can be configured to mechanically isolate the gate region G from the handle substrate 106 by an undercut distance $d_2$ of the gap $S_1$. The undercut distance $d_2$ can be selected to achieve a certain amount of isolation. For example, the undercut distance $d_2$ can extend beyond the gate region G and beneath the source and drain regions S and D (not shown). In another embodiment, a different active region of the semiconductor device 634 can be mechanically isolated. For example, the source region S and/or the drain region D can be mechanically isolated from the handle substrate 106 through an opening formed through source region S and/or the drain region D.

In some embodiments, the amount of undercut can be configured to provide mechanical isolation, but also retain a sufficient amount of the intermediary material 108 at the second side of 114 of the semiconductor device 634 such that the semiconductor device 634 does not readily decouple from the handle substrate 106. For example, the source region S and/or the drain region D can be undercut by the gap $S_1$ (e.g., adjacent the opening 110; FIG. 1D), with the undercut distance $d_2$ selected such that the third semiconductor material 328c does not readily decouple from the handle substrate 106. In another, non-illustrated embodiment, one or both of the source and drain regions S and D have no undercut at all or are only an undercut at one side (e.g., at the side adjacent the gate region G).

Figure 7:
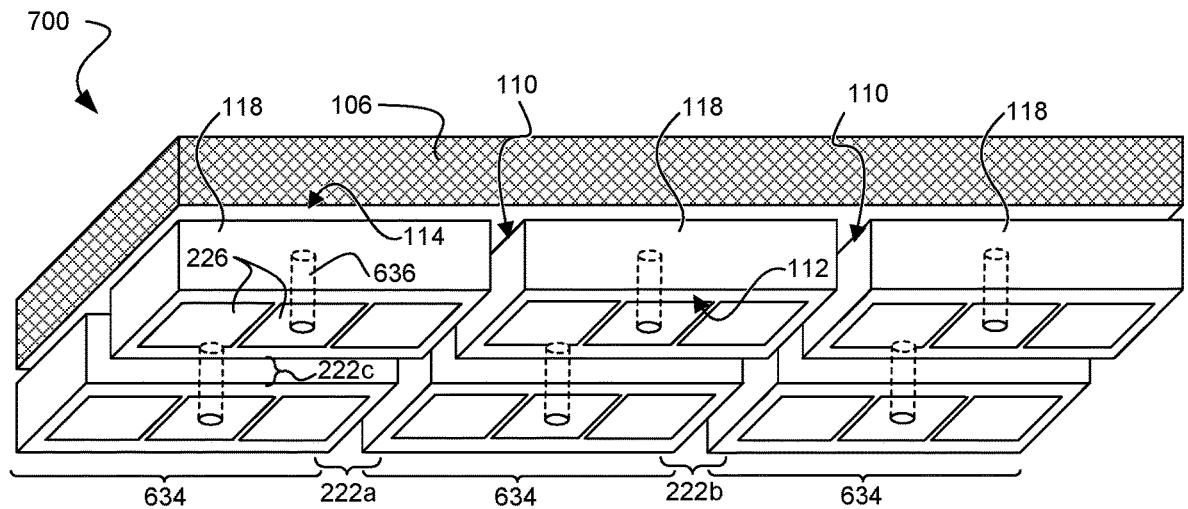
FIG. 7 is an isometric view of a semiconductor device assembly in accordance with a selected embodiment of the present technology.

FIG. 7 is an isometric view of a semiconductor device assembly 700 configured in accordance with a selected embodiment of the present disclosure. The semiconductor device assembly 700 can be similar to the semiconductor device assembly 100 after the processing stage of FIG. 1C (shown without the transfer structure 120 on the first side 112 of the semiconductor structure 102 in FIG. 7). However, the semiconductor device assembly 700 is different than the semiconductor device assembly 100 in that individual semiconductor devices 634 include the opening 636 through the semiconductor device 634. As shown, the openings 636 can be cylindrical; however, in other embodiments the openings 636 can have different shapes. For example, the openings 636 can be elongated trenches that are parallel with the first and second trenches 222a and 222b.

Also, the semiconductor device assembly 700 can be similar to the semiconductor device assembly 200 of FIG. 2. However, the semiconductor device assembly 700 is different than the semiconductor device assembly 200 in that the semiconductor devices 634 are configured to be singulated such that they include a portion of the handle substrate 106. In one embodiment, for example, the trenches 222 can provide locations for dicing streets, which can be subsequently cut to singulate the individual semiconductor devices 634 (e.g., via a dicing saw). In another embodiment, however, the trenches 222 can be omitted and the semiconductor devices 634 can be separated by conventional singulation techniques known in the art.

A person having ordinary skill in the art will recognize that semiconductor devices can be manufactured using other types of semiconductor device assemblies or other suitable structures without deviating from the scope of the various embodiments of the present technology. In general, a method of forming a semiconductor device can include forming a stack of semiconductor materials on a support structure (e.g., the support structure 104); forming openings in a stack of semiconductor materials (e.g., the semiconductor structure 102), where portions of the support structure are exposed through the openings; and undercutting at least a portion of the stack of semiconductor materials adjacent the openings in the stack semiconductor materials. In another example, a method of forming a semiconductor device can include forming a semiconductor structure that includes a first semiconductor material (e.g., the first semiconductor material 328a), a second semiconductor material (e.g., the second semiconductor material 328b), a first active region formed in the first semiconductor material (e.g., the source region S), a second active region formed in the first semiconductor material (e.g., the drain region D or the gate region G), and a trench between the first active region and the second active region.

Figure 8:
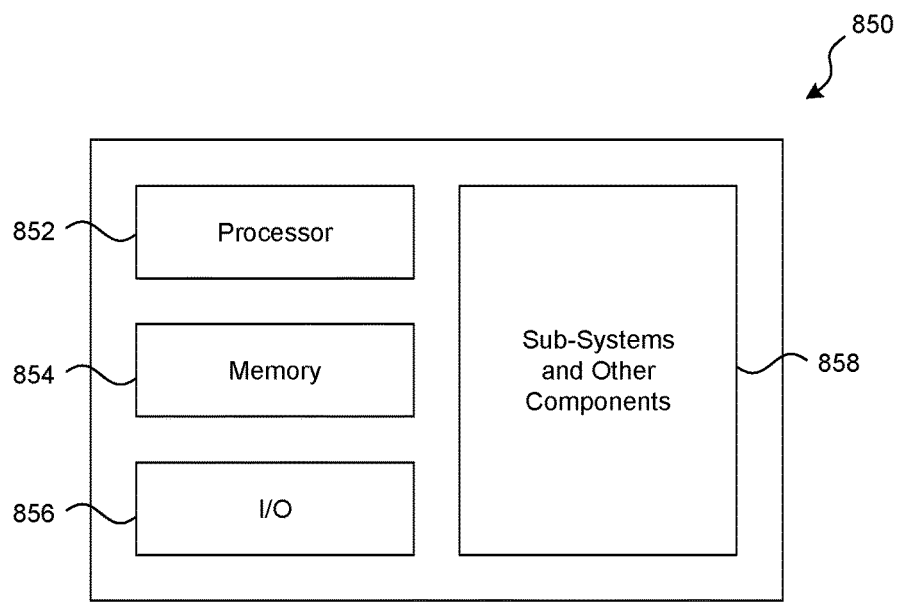
FIG. 8 is a block diagram illustrating a system that incorporates a semiconductor device in accordance with selected embodiments of the present technology.

Any one of the semiconductor devices and semiconductor device assemblies having the features described above with reference to FIGS. 1A-7 can be incorporated into any of a myriad of larger and/or more complex systems, a representative example of which is system 850 shown schematically in FIG. 8. The system 850 can include a processor 852, a memory 854 (e.g., SRAM, DRAM, flash, and/or other memory devices), input/output devices 856, and/or other subsystems or components 858. The semiconductor devices and semiconductor device assemblies described above with reference to FIGS. 1A-7 can be included in any of the elements shown in FIG. 8. The resulting system 850 can be configured to perform any of a wide variety of suitable computing, processing, storage, sensing, imaging, and/or other functions. Accordingly, representative examples of the system 850 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 850 include lights, cameras, vehicles, etc. With regard to these and other examples, the system 850 can be housed in a single unit or distributed over multiple interconnected units, e.g., through a communication network. The components of the system 850 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. For example, the semiconductor device assemblies 100, 200, and 700 shown, respectively, in FIGS. 1, 2, and 7 can include a variety of other features. For example, these assemblies and others can be configured to form multiple semiconductor devices rather than a single semiconductor device. In addition, the semiconductor device assemblies can include a network of conductive structures (e.g., traces) for intercoupling semiconductor devices. As another example, the semiconductor devices 224, 324, 424, 524, and 634 shown, respectively, in FIGS. 2-7 can similarly include a variety of other features. For example the gate region G can include multiple semiconductor materials between the first semiconductor material 328*a* and the third electrical contact 226*c* to achieve a particular operating parameter (e.g., a capacitance). Certain aspects of the new technology described in the context of particular embodiments may also be combined or eliminated in other embodiments. Additionally, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:
   a support structure having a handle substrate and a removable intermediary material; and
   a semiconductor structure having a first side and a second side opposite the first side, wherein the semiconductor structure includes a gate region of a transistor device, and wherein an opening extends through a portion of the gate region, and wherein a trench extends from the first side and at least partially through the semiconductor structure;
   wherein the removable intermediary material is between and mechanically coupling the handle substrate and the second side of the semiconductor structure, wherein the opening extends through a portion of the removable intermediary material but does not extend through the handle substrate, and wherein the removable intermediary material is recessed from the opening by an undercut distance such that an undercut extends between the gate region and the handle substrate, wherein the undercut distance is sufficiently large such that the removable intermediary material is absent from between the gate region and the handle substrate, and wherein no solid material is disposed between the second side of the semiconductor structure and the handle substrate in a region overlapping the gate region.

2. The semiconductor device assembly of claim 1 wherein the trench is a first trench, and the semiconductor device assembly further comprises a second trench extending from the first side and at least partially through the semiconductor structure, and wherein:
   the semiconductor structure includes source and drain regions of the transistor device;
   the gate region is between the source and drain regions;
   the source region is adjacent the first trench;
   the drain region is adjacent a second trench; and
   the first and second trenches define a mesa of the semiconductor structure.

3. The semiconductor device assembly of claim 2 wherein the first trench is between the source and gate regions and the second trench is between the drain and gate regions.

4. The semiconductor device assembly of claim 2 wherein the opening and the first and second trenches each include vertical sidewalls in parallel with one another.

5. The semiconductor device assembly of claim 1, further comprising a dielectric material attached to the semiconductor structure at the first side, wherein the trench extends through the dielectric material.

6. The semiconductor device assembly of claim 1 wherein the transistor device is a power transistor device.

7. The semiconductor device assembly of claim 1 wherein the handle substrate comprises a poly-Aluminum Nitride (p-AlN) substrate.

8. The semiconductor device assembly of claim 1, further comprising a plurality of electrical contacts attached to the semiconductor structure at the first side and protruding away from the handle substrate.

9. The semiconductor device assembly of claim 1 wherein the handle substrate and a portion of the semiconductor structure at the second side of the semiconductor structure are separated by a gap in the removable intermediary material adjacent to the opening.

10. The semiconductor device assembly of claim 1 wherein the opening defines a passageway (a) extending from at least the first side of the semiconductor structure to at least the removable intermediary material at the second side of the semiconductor structure, and (b) configured to flow the etchant from the first side to the second side to remove a portion of the removable intermediary material.

11. The semiconductor device assembly of claim 1 wherein the semiconductor structure includes a first semiconductor material at the first side, a second semiconductor material at the second side and a third semiconductor material between the first and second semiconductor materials, and wherein the trench extends from the first semiconductor material through the third semiconductor material.

12. A semiconductor device assembly, comprising:
   a support structure having a handle substrate;
   a semiconductor structure attached to the handle substrate and having a first semiconductor material, a second semiconductor material, an active region between the first and second semiconductor materials, and an opening extending through the first semiconductor material and the active region, wherein the opening does not extend through the handle substrate, wherein the active region includes a source region, a drain region, and a gate region between the source and drain regions, and wherein the semiconductor structure includes a first side and a second side opposite the first side;
   a removable intermediary material of the support structure, the removable intermediary material being between and mechanically coupling the handle substrate and the second semiconductor material, wherein the opening extends through a portion of the removable intermediary material, and wherein the removable intermediary material is recessed from the opening by an undercut distance such that an undercut extends between the gate region and the handle substrate, wherein the undercut distance is sufficiently large such that the removable intermediary material is absent from between the gate region and the handle substrate, and wherein no solid material is disposed between the second semiconductor material and the handle substrate in a region overlapping the gate region;
   a first trench extending from the first side of the semiconductor structure through the first semiconductor material at least to the active region, wherein the first trench extends between and at least partially mechanically isolates the source and gate regions; and
   a second trench spaced apart from the first trench and extending from the first side of the semiconductor structure through the first semiconductor material at least to the active region, wherein the second trench extends between and at least partially mechanically isolates the drain and gate regions.

13. The semiconductor device assembly of claim 12 wherein the first trench is between a first portion of the first semiconductor material and a second portion of the first semiconductor material, and wherein the second trench is between a third portion of the first semiconductor material and the second portion of the first semiconductor material.

14. The semiconductor device assembly of claim 13 wherein the first and second trenches are separated from each other by the second portion of the first semiconductor material.

15. The semiconductor device assembly of claim 12 wherein the first and second trenches each include vertical sidewalls parallel to each other.

16. The semiconductor device assembly of claim 12 wherein the first and second trenches define a mesa.

17. The semiconductor device assembly of claim 12, further comprising a plurality of electrical contacts attached to the semiconductor structure at the first side and protruding away from the handle substrate.

18. The semiconductor device assembly of claim 12, further comprising a dielectric material attached to the semiconductor structure at the first side, wherein the first trench and/or the second trench extends through the dielectric material.

19. The semiconductor device assembly of claim 12, further comprising a dielectric material and an electrical contact adjacent the dielectric material, wherein the dielectric material and electrical contact are attached to the semiconductor structure at the first side.

20. The semiconductor device assembly of claim 12 wherein the first and second trenches do not extend through the active region.

21. The semiconductor device assembly of claim 12, wherein the opening extends through the gate region and defines a passageway extending from at least the first side of the semiconductor structure to at least the removable intermediary material at the second side of the semiconductor structure.

* * * * *